United States Patent [19]

Miller

[11] Patent Number: 4,631,730

[45] Date of Patent: Dec. 23, 1986

[54] LOW NOISE INJECTION LASER STRUCTURE

[75] Inventor: Stewart E. Miller, Middletown Township, Monmouth County, N.J.

[73] Assignee: Bell Communications Research, Inc., Livingston, N.J.

[21] Appl. No.: 655,258

[22] Filed: Sep. 28, 1984

[51] Int. Cl.$^4$ ............................................. H01S 3/19
[52] U.S. Cl. ........................................ 372/50; 372/19; 372/32; 372/92
[58] Field of Search ...................... 372/32, 29, 50, 19, 372/20, 26, 92, 44

[56] References Cited

U.S. PATENT DOCUMENTS

| | | | |
|---|---|---|---|
| 3,790,902 | 2/1974 | Miller | 372/49 |
| 3,902,133 | 8/1975 | Watts | 372/50 |
| 3,978,426 | 8/1976 | Logan et al. | 372/45 |
| 3,982,207 | 9/1976 | Dingle et al. | 372/45 |
| 3,993,963 | 11/1976 | Logan et al. | 372/45 |
| 4,054,363 | 10/1977 | Suematsu | 350/96 |
| 4,371,966 | 2/1983 | Scifres et al. | 372/45 |
| 4,461,007 | 7/1984 | Burnham et al. | 372/45 |

OTHER PUBLICATIONS

F. Koyama et al., "Suppression at Intensity Fluctuation of a Longitudinal Mode in Directly Modulated GaInAsP/InP Dynamic Single Mode Laser", *Elect. Lett.* 28 Apr. '83, vol. 19, #19, 325–327.

Y. Tohmori et al., "Wavelength Tuning...", *Elet. Lett.* 18 Aug. '83, vol. 19, No. 17, pp. 656–657.

T. Tanbun-EK et al., "Static Characteristics of 1.5–1.6 μm GaInAsP/InP Buried Heterostructure Butt-Jointed Built-In Integrated Lasers", *IEEE Journal of Quantum Electronics*, QE-20, Feb. 1984, No. 2, pp. 131–140.

"An AlGaAs Window Structure Laser", by H. O. Yonezu, M. Ueno, T. Kamesjima and I. Hayashi, *IEEE J. of Quantum Electronics*, vol. QE-15, No. 8, Aug. 1979, pp. 775–781.

"The CW Electro-Optical Properties of (Al,Ga) As Modified-Strip Buried-Heterostructure Lasers", by R. L. Hartman, R. A. Logan, L. A. Koszi and W. T. Tsang, *J. Appl. Phy.*, vol. 51, No. 4, Apr. 1980, pp. 1909–1918.

"Distributed Feedback InGaAsp/InP Lasers With Window Region Emitting at 1.5 Micron Range", by S. Akiba, K. Utaka, K. Sakai and Y. Matsushima, *IEEE J. Quantum Electronics*, vol. QE-19, No. 6, Jun. 1983, pp. 1052–1056.

"Oscillation Frequency Shift Suppression of Semiconductor Lasers Coupled to External Cavity", T. Fujita, J. Ohya, S. Ishizuka, K. Fujito, H. Sato, *Electronic Letters*, vol. 20, No. 10, 10 May 1984, pp. 416–417.

"Characteristics of Single-Longitudinal-Mode Selection in Short-Coupled-Cavity (SCC) Injection Lasers", C. Lin, C. A. Burrus, Jr., L. A. Coldren, *J. of Lightwave Technology*, vol. LT-2, No. 4, Aug. 1984, pp. 544–549.

O. S. A. Meeting on Optical Fibers Communication—Jan. 23–25, 1984, *Technical Digest* OFC '84, Paper MF2, pp. 14–16.

*Primary Examiner*—James W. Davie
*Attorney, Agent, or Firm*—James W. Falk; Stephen M. Gurey

[57] ABSTRACT

The present invention pertains to an injection laser which advantageously reduces main mode output power fluctuation. The laser comprises a laser cavity having an active material joined at one end to a passive waveguide. The passive waveguide has a length which is equal to or greater than the length of the active material and an index of refraction which is substantially equal to that of the active material to prevent multicavity interference. In preferred embodiments of the present invention, the passive material is fabricated from a semiconductor material having a bandgap which is larger in energy than the energy of a photon in the laser radiation.

17 Claims, 15 Drawing Figures

LOW NOISE INJECTION LASER STRUCTURE

BACKGROUND OF THE INVENTION

This invention relates to the field of lasers and more specifically to the field of injection lasers.

Present silica-based optical fibers can be fabricated to have a loss in the 1.3–1.6 micron wavelength region which is an order of magnitude lower than the loss occurring at the 0.85 micron wavelength of present lightwave communications systems, e.g., ¼ db/km versus 2–3 db/km. Furthermore, these fibers can be fabricated to have a transmission delay distortion in the 1.3–1.6 micron wavelength region which is two orders of magnitude lower than the transmission delay distortion at 0.85 microns, e.g., 1–2 ps/km nm versus 100+ ps/km nm. Thus, the dispersion-limited transmission distance for high bit rate lightwave communications systems can be maximized by using a single-frequency, i.e., single-longitudinal-mode, injection laser generating output at the 1.55 micron wavelength where the fibers have minimum loss. For these reasons, present efforts in the development of lightwave communications systems are aimed at the 1.3–1.6 micron wavelength region instead of at the wavelength region surrounding 0.85 microns.

InGaAsP injection lasers produce output in the desired 1.3–1.6 micron wavelength region. However, typical single-resonator InGaAsP injection lasers have a laser cavity length in the 250–300 micron range. This results in mode spacing between 6 and 9 Angstroms. Since the gain spectral width of InGaAsP injection lasers is approximately 250–300 Angstroms, there are more than 30 longitudinal modes under the gain spectral width of a 250 micron long laser. Thus, the gain difference between modes is small and mode discrimination between the main mode and side modes is poor in InGaAsP injection lasers.

The injection laser, like all other oscillators, is perturbed by internal random processes which cause its output to fluctuate. One example of this, known as mode-partition-noise, is the fluctuation at turn-on in the relative intensities of various laser modes while the total output power of the laser remains fixed. Mode-partition-noise is a consequence of random fluctuations in the photon densities of the various modes at the moment threshold is reached.

A great deal of time has been expended in an effort aimed at decreasing mode-partition-noise. These efforts generally involve the use of lasers with improved mode selectivity. However, even if the mode-partition-noise is substantially decreased, main mode power fluctuations in the laser output (even in a dc operated laser) impose an ultimate limit on the performance of any lightwave communications system. Experimental observations indicate that power dropouts frequently occur in the main spectral line of dc-biased injection lasers having nearly single-longitudinal-mode behavior. These dropouts can cause errors in a communications system when the ratio of the main mode to side mode power is less than 50:1.

Main mode power fluctuations generally result from at least two significantly different physical mechanisms: (1) as a direct result of main mode photons interacting with the carrier density; i.e., a given photon may stimulate another photon or be absorbed and (2) as a result of gain fluctuations driven by carrier-density fluctuations, the latter resulting from photon-electron interactions of all modes—i.e., the main mode and all side modes—interacting with the carrier density. The side mode photon density interacts with the main mode photon density only through the carrier density; however, because the variance of the side mode photon density is far larger than that of the main mode (a consequence of the very small number of photons in the side mode), the side mode influence on the carrier density can be significant even though the mean value of the side mode power is low. The second mechanism can bring about mode dropouts when the mean value of the side mode power is large enough so that its fluctuating value can be larger than the fluctuating value of the main mode power, with enough joint probability to be significant.

SUMMARY OF THE INVENTION

Advantageously, embodiments of the present invention substantially reduce main mode power fluctuations in nearly single-longitudinal-mode injection lasers by raising the internal Q of the resulting structure over that of a conventional Fabry-Perot injection laser without adding photon-carrier density interactions.

Specifically, an injection laser fabricated in accordance with the teachings of the present invention comprises a laser cavity having a gain or active material joined at one end to a passive waveguide. The passive waveguide has an index of refraction which is substantially equal to that of the active material in order to prevent multicavity interferences. The passive waveguide has a length which is greater than or equal to the length of the active material.

Since the passive waveguide has essentially no loss or gain, it serves as a noise-free reservoir of photons. This increases the Q of the laser and reduces the main mode power fluctuations.

In accordance with an illustrative embodiment of the present invention the passive material is a semiconductor material having a larger bandgap than the active semiconductor material.

BRIEF DESCRIPTION OF THE DRAWING

A complete understanding of the present invention may be gained from a consideration of the following detailed description presented hereinbelow taken in connection with the accompying drawing, in which.

To facilitate understanding, identical reference numerals are used to designate identical elements common to the figures.

DETAILED DESCRIPTION

Figure 1:
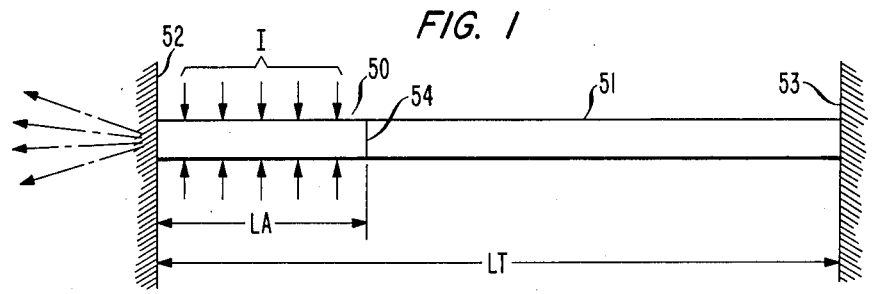
FIG. 1 shows, in block form, the general structure of the various embodiments of the present invention.

FIG. 1 shows, in block form, the general structure of injection lasers that are constructed in accordance with the present invention. Relatively lowloss passive waveguide 51 is disposed adjacent to active gain region 50 in a laser cavity formed by mirrors 52 and 53. Passive waveguide 51 is an index-guided region in which an electromagnetic wave is carried between mirror 53 and the interface between regions 50 and 51, i.e., junction 54. The index of refraction of passive waveguide 51 should be substantially equal to that of active region 50 in order to reduce multicavity interference effects.

Active region 50 may either be gain-guided or index-guided according to the particular embodiment, as is more fully described hereinbelow. The length of active region 50 is LA and the total length of the laser cavity is LT. Embodiments of the present invention are constructed so that LT is preferably greater than or equal to 2LA.

The combination of active and passive waveguide regions constructed according to the present invention has a higher internal Q than the active region alone. Since this occurs without adding photon-carrier density interactions, main mode fluctuations in the laser output are significantly reduced.

In an illustrative embodiment of the present invention, using semiconductors, passive waveguide region 51 is a semiconductor material having a larger bandgap than active region 50. Thus, photons generated in active region 50 do not interact in passive waveguide 51. Passive waveguide 51 is formed from an alloy which has a different composition from that of active region 50. Because the alloy providing a larger bandgap for passive waveguide 51 results in an index of refraction which is very close to that of active region 50, there is no appreciable reflection at junction 54. In other embodiments passive waveguide 51 could be a different material from that of active region 50. For example, active region 50 could be a III-V compound or an alloy of III-V materials and passive waveguide 51 could be SiN or glasses of various kinds. Mirrors 52 and 53, at the ends of the laser cavity, can either be simple cleaved facets or more complex structures having wavelength selectivity, as more fully described in my co-pending patent application Ser. No. 655,257, entitled "Single Mode Injection Laser Structure", which has been filed simultaneously herewith and which is incorporated by reference herein.

Figure 2:
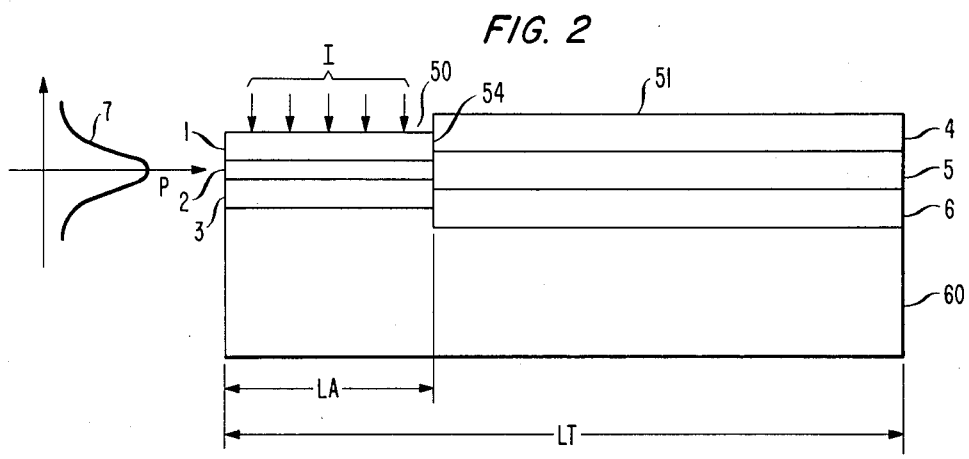
FIG. 2 shows, in pictorial form, an embodiment of the present invention in which the active region and the passive waveguide region are fabricated fzom semiconductor materials.

FIG. 2 shows an "all-semiconductor" embodiment of the present invention and more particularly shows a slice through the structure taken substantially perpendicular to the top and bottom surfaces and along its longitudinal axis, i.e., the latter being the direction of laser beam propagation in the laser cavity. Layers 1, 2, 3, 4, 5 and 6 are epitaxially grown on InP substrate 60 by liquid phase epitaxy (LPE) or other techniques well known to those skilled in the art. For clarity, FIG. 2 only shows those layers directly involved in lightwave generation and guidance. It is well known in the art that other layers may be situated on top of layer 1 both to facilitate electrical contact and also to confine the injection current, which provides carriers to active region 50, to a narrow stripe in order to provide transverse guidance of the laser beam. Layer 2 is an active InGaAsP semiconductor alloy layer having a thickness in the range of 0.1 to 0.2 microns. Layers 1 and 3 are light guidance and carrier-confinement layers which have a larger bandgap than layer 2 and may illustratively be InGaAsP alloys or InP. At junction 54 the compositions of the layers change in order to form passive waveguide 51. Layers 4, 5 and 6 comprise passive waveguide 51. Layer 5 has a larger index of refraction than layers 4 and 6. Illustratively, layer 2 can have a bandgap with an emission peak at 1.5 microns and layer 5 can have a bandgap with an emission peak at 1.3 microns. Thus, photons generated in layer 2 will not have enough energy to be absorbed in layer 5.

Because of the above-described guidance properties of the structure, the peak photon density in the structure occurs in or near layers 2 and 5, with decreasing density occurring in the adjacent cladding layers. This is illustrated by curve 7 in FIG. 2.

Figure 3:
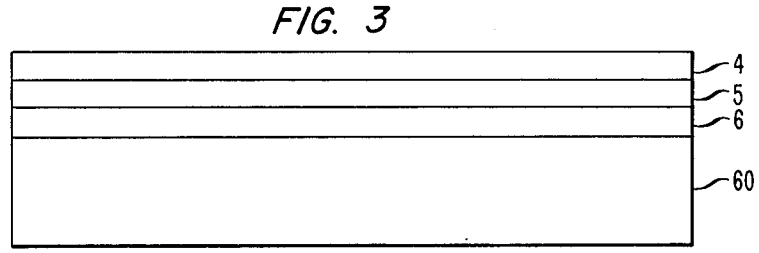
FIGS. 3–5 show, in pictorial form, structures formed at various stages in the fabrication of the embodiment shown in FIG. 2.

A method of fabricating the embodiment shown in FIG. 2 will now be described. FIG. 3 shows InP substrate 60. Epitaxial layers 4, 5 and 6 are grown over the entire surface of substrate 60. Then, as shown in FIG. 4, after photolithography and well known etching techniques are applied to the structure shown in FIG. 3, a portion of these layers is removed to expose InP substrate 60 in the region which is to become the active region of the final laser structure.

Figure 4:
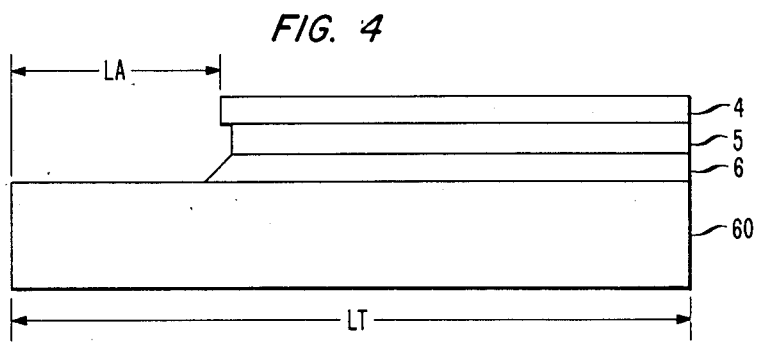
Figure 5:
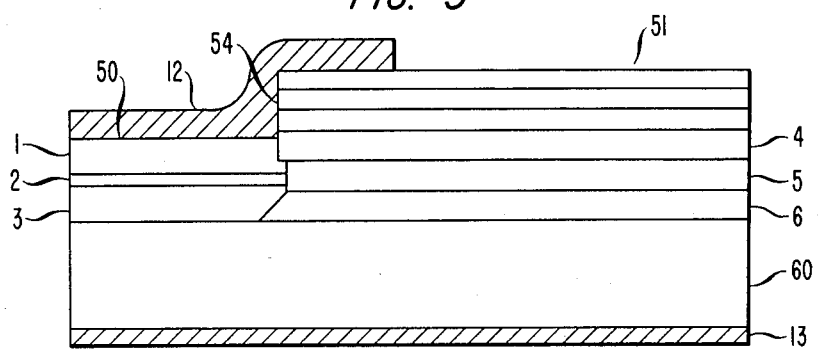

FIG. 5 shows the structure resulting after layers 3, 2 and 1 are epitaxially grown on the structure shown in FIG. 4. Metal layer 12 has been deposited in areas where current flow is desired. Metal layer 13 acts both as an electrode for current injection along with layer 12 and as a heat sink for the structure. Note that junction 54, between active region 50 and passive waveguide 51, need not be perpendicular to the direction of light propagation because the change in the index of refraction across the junction is small and therefore causes little reflection or deflection of the lightwaves in the laser cavity.

In order to provide single moded laser output, the transverse structure of the laser must be designed to maintain a single transverse mode. Many methods are known in the art for fabricating structures having a single transverse mode, e.g., buried heterostructures, dual-channeled buried heterostructures, ridge or rib waveguides and stripe contact defined structures. Also, passive waveguide 51 need not have a single transverse mode as long as active region 50 does.

Figure 6:
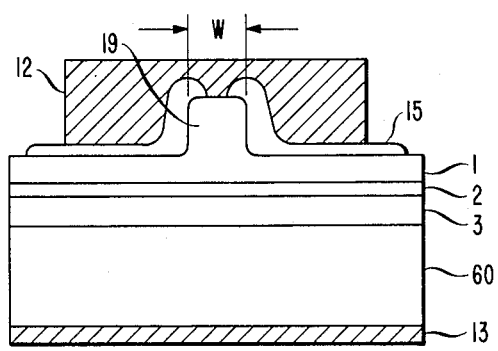
FIG. 6 shows, in pictorial form, an embodiment of the present invention in which a ridge waveguide structure is used to provide a single transverse mode in the active region.

Furthermore, any one of many standard laser structures may be used to guide the laser beam in the transverse plane perpendicular to the direction of propagation of the laser beam. For example, a version of a ridge waveguide is shown in FIG. 6 which depicts a slice taken through the active region of the structure in a plane perpendicular to the direction of propagation of the laser beam. Specifically, layer 1 has ridge 19 of width W and is partially covered by SiN insulating layer 15. In order to maintain a single transverse mode, in an illustrative embodiment of the invention, W is approximately 5 microns. Ridge 19 can be fabricated to extend across the entire length, LT, of the laser, i.e., covering both active region 50 and passive waveguide 51.

Figure 9:
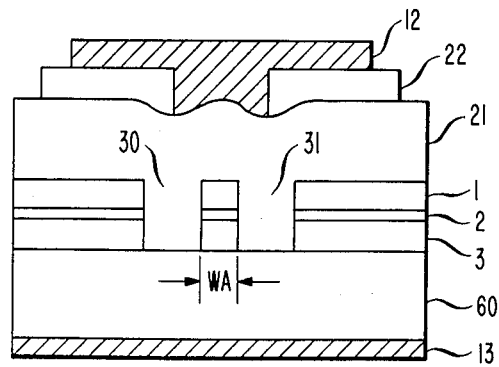
FIG. 9 shows, in pictorial form, an embodiment of the present invention in which a dual-channel buried heterostructure is used to provide transverse guidance in the active region.

Another structure for providing transverse guidance in active region 50 is a dual-channel buried heterostructure. This is shown in FIG. 9. After growing layers 3, 2 and 1, a pair of channels 30 and 31 are etched to leave a mesa having width WA. Then, a lower index layer 21, often InP, which serves as a confining region, may be grown in the groove. Channels 30 and 31 may extend the entire length LT of the laser structure. Layers 12 and 13 are metallic contact layers; layer 60 is an n-InP substrate; layer 3 is an n-InGaAsP layer; layer 2 is a p-InGaAsP layer; layer 1 is a p-InP layer; layer 21 is a p-InP layer and layer 22 is a $SiO_2$ layer. An example of a dual-channel buried heterostructure is shown in the Technical Digest OFC '84 O.S.A. meeting on Optical Fiber Communication Jan. 23-25, 1984, paper MF2, FIG. 1, page 15.

A further well-known structure, not shown in the figures, for providing transverse guidance in active region 50 is a stripe-contact current injection structure.

The structures providing transverse guidance in active region 50 may optionally be fabricated by bombarding the areas adjacent to active region 50 to make them highly resistive instead of using insulating layers as previously described. Furthermore, injection current top contact 12 can be extended over passive waveguide 51 to further reduce photon absorption in the waveguide. However, when the gain peak for passive waveguide 51 is chosen to be 1.3 microns, there will only be a small improvement in performance due to the extended top contact when active region 50 emits at 1.5 microns. Note that the principal contribution towards reduction of the photocarrier interaction in passive waveguide 51 occurs whenever the bandgap of passive waveguide 51 is larger than that of action region 50. Furthermore, the reduced photon absorption in the passive waveguide advantageously provides the significant reduction in main mode fluctuations in the laser output.

Figure 7:
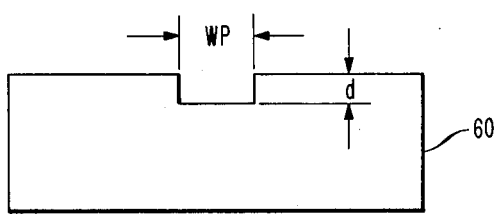
FIGS. 7 and 8 show, in pictorial form, structures formed at various stages in the fabrication of an embodiment of the present invention having transverse guidance for the passive waveguide region.
Figure 8:
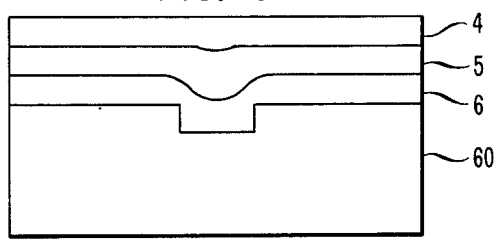

A structure providing transverse guidance in passive waveguide 51, independent of active region 50, is fabricated as shown in FIGS. 7 and 8. A groove having width WP and depth d is etched in InP substrate 60. Illustratively, WP is approximately 10 microns and d is between 3 and 5 microns. Layers 6, 5 and 4, which together form passive waveguide 51, are epitaxially grown on the structure shown in FIG. 7 to give the structure shown in FIG. 8. Illustratively, layer 6 is grown with a thickness of approximately 1 micron and layer 5 with a thickness of approximately 2 microns and layer 4 with a thickness of approximately 1 micron. The bulge caused by the groove in substrate 60 will cause layer 5 to confine lightwave energy in the transverse direction. Then layer 3, situated in the active region, is grown sufficiently thick to isolate active layer 2 from the effects of the groove in substrate 60 and to ensure that active layer 2 will mate with passive layer 5. The structure providing transverse guidance for the active region can be chosen to be any of the well-known structures, e.g., the structure shown in FIG. 6.

Figure 10:
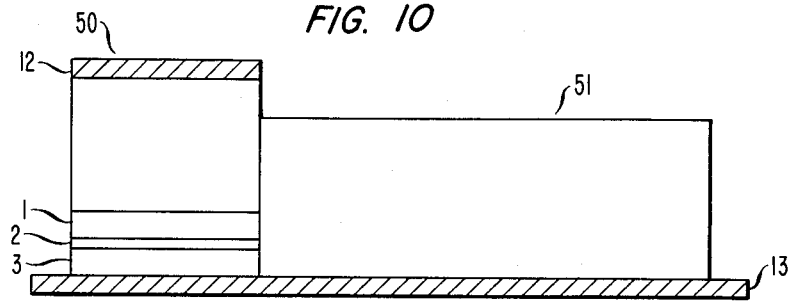
FIG. 10 shows, in pictorial form, an embodiment of the present invention comprising an active laser region butt-joined to a passive waveguide region.

Alternative embodiments of the present invention are fabricated by butt-joining a conventional injection laser to a passive waveguide structure. For example, FIG. 10 shows passive waveguide structure 51 lined up with active region 50 on heat sink 13. Active region 50 is disposed directly on heat sink 13.

Figure 11:
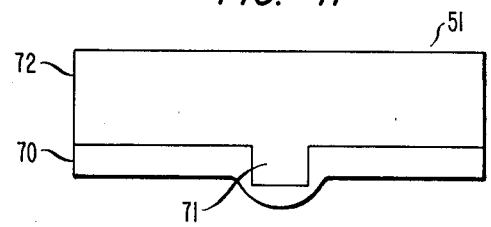
FIGS. 11 and 12 show, in pictorial form, two views of an illustrative SiO$_2$ glass system passive waveguide structure to be used in the embodiment of the present invention shown in FIG. 10.

FIG. 11 shows a cross section of an illustrative passive waveguide structure 51 fabricated in an $SiO_2$ glass system. The plane of FIG. 11 is perpendicular to the direction of laser beam propagation in the structure. Waveguide layer 71 is germanium-doped $SiO_2$. Waveguide layer 71 is fabricated by growing a germanium-doped $SiO_2$ layer over the entire face of $SiO_2$ substrate 72. Then the germanium-doped $SiO_2$ layer is etched to form waveguide layer 71 having a 5 micron square cross section. Waveguide layer 71 is then covered with 2 micron thick $SiO_2$ layer 70.

Figure 12:
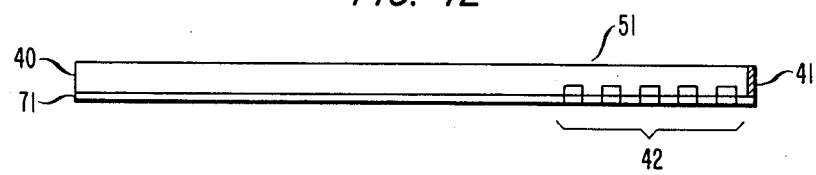

FIG. 12 shows a slice through the passive waveguide structure 51, shown in FIG. 11, taken along its longitudinal axis, i.e., the direction of laser beam propagation. End 41 of passive waveguide 51, opposite the active region, could have a simple mirror coating, either metallic or dielectric, to form a broad-band reflector or a multi-layer dielectric coating in the form of a frequency selective reflector. Alternatively, passive waveguide 51 could contain a grooved grating, as shown by grating 42 in FIG. 12, to provide a frequency-selective reflector.

Figure 13:
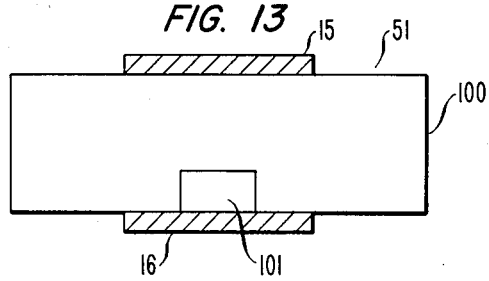
FIG. 13 shows, in pictorial form, an illustrative LiNbO$_3$ passive waveguide structure to be used in the embodiment of the present invention shown in FIG. 10.

In a further embodiment of the present invention, passive waveguide 51 is a $LiNbO_3$ waveguide formed by the diffusion of titanium. Of course, one could use any alternative technique to increase the index of refraction and form a waveguide in the $LiNbO_3$. A cross section of this structure is shown in FIG. 13. Waveguide 101 is diffused into $LiNbO_3$ substrate 100. A grating can also be used in this embodiment at a position as shown by grating 42 in FIG. 12. The grating grooves may be air or a low index dielectric such as epoxy, $SiO_2$ or SiN. In this embodiment, the electro-optic effect may be used to alter the frequency-selection property of the grating when metallic electrodes 15 and 16 are deposited on substrate 100. In an illustrative embodiment metallic electrodes 15 and 16 are approximately 3 to 10 microns wide.

Figure 14:
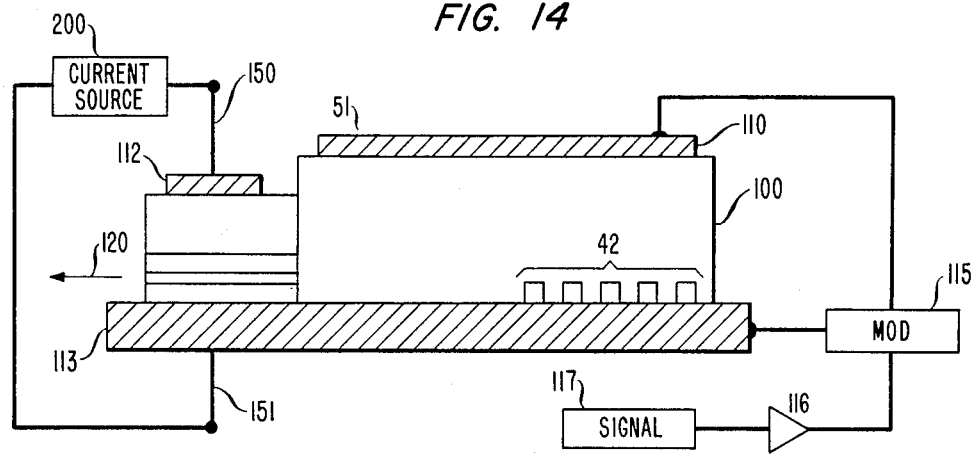
FIG. 14 shows, in pictorial form, the transmitting end of a lightwave communications system which comprises an embodiment of the present invention.

FIG. 14 shows an embodiment of the present invention which utilizes the electro-optic effect to form the transmitting end of a communications system. Active region 50 is butt-joined to passive waveguide 51. Passive waveguide 51 is fabricated as described hereinabove, and as specifically shown in FIG. 13. The laser output beam is generated in the direction shown by arrow 120. Current injection source 200 is applied across electrodes 150 and 151 to metallic contacts 112 and 113 of active region 50 to provide lasing action thereof. Communications signal information is provided from signal source 117, through amplifier 116, to modulator 115. Modulator 115 provides a voltage, carrying the signal information, to metallic contacts 110 and 113 and thereby to passive waveguide 51. The voltage applied across metallic contacts 110 and 113 varies the index in grating 42. This changes the frequency of peak reflectance of grating 42 and hence the frequency of the laser output. The structure shown in FIG. 14 can be used as an analog frequency modulated (FM) or as a digital frequency-shift keyed (FSK) transmitter.

Figure 15:
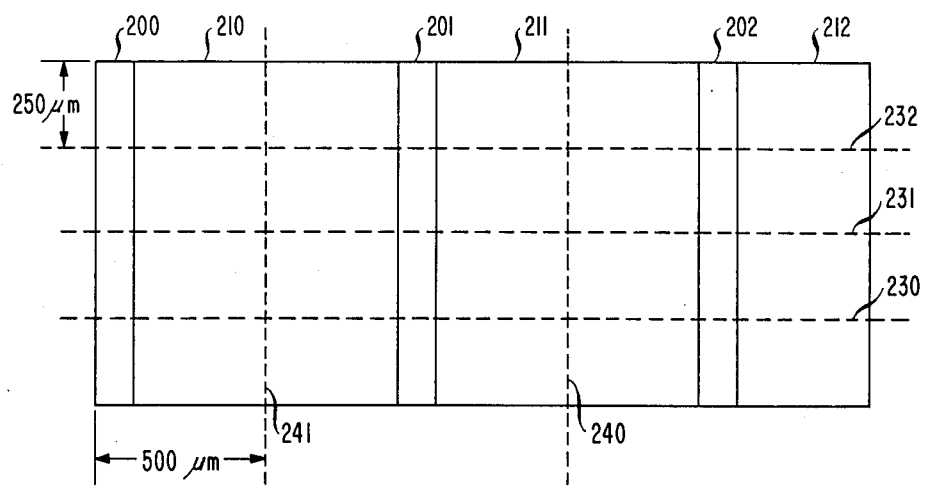
FIG. 15 shows, in pictorial form, a wafer structure formed at one stage of a batch fabrication method for embodiments of the present invention.

FIG. 15 illustrates a method for fabricating injection lasers, according to the present invention, in a batch processing procedure analogous to batch processing procedures used in making injection lasers of various types. In particular, this figure shows the broad face of a wafer which is used to make many lasers simultaneously. Dotted lines 230–232, 240 and 241 represent cleavage planes after the wafer is processed. Illustratively, the length, LT, of the laser is 500 microns and the length, LA, of the active region is 100 microns. Although, for ease of handling, a laser chip is chosen to be 250 microns wide, the transverse width of the active laser layer comprises only a few microns of the full 250 micron width. Layers 4, 5 and 6, which together form passive waveguide 51, as described hereinabove, are grown over the entire wafer surface. Then layers 4, 5 and 6 are etched away in strips 200–202 that are to become the active regions of the laser. Next layers 1, 2 and 3 are grown to form the active regions. The particular structure for providing transverse guidance is formed on the wafer using lithographic techniques in the appropriate regions as has been described hereinabove. Finally, using known scribe-and-cleave procedures, the wafer is then broken into individual lasers. Typically, a wafer fabricated in this manner yields hundreds of lasers.

I have studied laser output parameters, which are described in my above-mentioned co-pending patent application, such as the main mode time constant and the main mode to side mode ratio for embodiments of the present invention described hereinabove. I have discovered that use of a passive waveguide region increases the main mode time constant and reduces the main mode to side-mode ratio. For example, a laser constructed in accordance with the principles of my invention and having an active length, LA, of 70 microns and a total cavity length, LT, of 250 microns, has a main mode time constant of 0.8 nanoseconds and a main mode to side mode ratio of 3.3 when running at about $\frac{3}{4}$ mW in the main mode. This is to be compared with a laser having LA=LT=250 microns which has a main mode time constant of 1.6 nanoseconds and a main mode to side mode ratio equal to 10.8 when running at about $\frac{3}{4}$ mW in the main mode. Both the time constant and the modal ratio change as the loss difference between the main and the side modes becomes smaller. This occurs when the low-loss passive waveguide section is present because the absolute level of loss and hence the absolute level of gain in the laser is reduced. With a lower absolute level of gain, the difference in the gain between the main mode and side mode wavelengths becomes smaller by reason of the shape of the gain curve. It is this difference which gives the equilibrium modal power ratio when there is no wavelength selective loss in the laser structure. Thus, it is advantageous to fabricate embodiments of the present invention to include means for preferentially suppressing laser action in modes other than the main longitudinal mode of the laser cavity. To accomplish this, these means should advantageously provide small amplitude loss as is more fully described in detail in my above-referenced copending patent application.

It should also be clear to those skilled in the art that further embodiments of the present invention may be made by those skilled in the art without departing from the teachings of the present invention.

What is claimed is:

1. An injection laser comprising:

an active laser region having a first end and a second end, the first end being a partial reflector of laser radiation generated in the active laser region, means for injection pumping the active laser region to produce the laser radiation, and a passive waveguide region having a first end and a second end, the first end being a partial reflector of the laser radiation, and wherein the active laser region and the passive waveguide region are joined to one another at the second ends of each one to form a laser cavity between the respective first ends of the active laser and the passive waveguide regions; and wherein the passive waveguide region has an index of refraction which is substantially equal to the index of refraction of the active region and is substantially loss and reflection free and frequency nonselective for a length which is at least as great as the length of the active laser region.

2. An injection laser comprising:

an active laser region having a first end and a second end, the first end being a partial reflector of laser radiation generated in the active laser region, means for injection pumping the active laser region to produce the laser radiation, a passive waveguide region having a first end and a second end, and a laser partial reflector of the laser radiation, wherein the active laser region and the passive waveguide region are joined to one another at the second ends of each one, the laser partial reflector is joined to the first end of the passive waveguide region to form a laser cavity between the laser partial reflector and the first end of the active laser region, and the passive waveguide region further having an index of refraction which is substantially equal to the index of refraction of the active region and is substantially loss and reflection free and frequency nonselective for a length which is at least as great as the length of the active laser region.

3. An injection laser comprising:

an active laser region having a first end and a second end, means for injection pumping the active laser region to produce laser radiation, a passive waveguide region having a first end and a second end, and a first and a second partial reflector of the laser radiation, wherein the active laser region and the passive waveguide material are joined to one another at the second ends of each one, the first partial reflector is joined to the first end of the passive waveguide region, and the second partial reflector is joined to the first end of the active laser region to form a laser cavity between the first and second partial reflectors, and the passive waveguide region further has an index of refraction which is substantially equal to the index of refraction of the active laser region and is substantially loss and reflection free and frequency nonselective for a length which is at least as great as the length of the active laser region.

4. The injection laser of claims 1, 2 or 3 wherein the passive waveguide region comprises a semiconductor material having a bandgap which is larger in energy than the energy of a photon of the laser radiation generated in the active laser region.

5. The injection laser of claims 1, 2 or 3 wherein the passive waveguide region comprises an SiN layer.

6. The injection laser of claims 1, 2 or 3 wherein the passive waveguide region comprises a germanium-doped SiO$_2$ layer.

7. The injection laser of claims 1, 2 or 3 wherein the passive waveguide region comprises an LiNbO$_3$ layer.

8. The injection laser of claim 7 wherein the LiNbO$_3$ layer has a grating disposed therein.

9. The injection laser of claim 8 wherein the passive waveguide further comprises metal electrodes disposed across the grating and a variable source of voltage applied across the electrodes whereby a variable electric field is applied to the grating.

10. The injection laser of claims 2 or 3 wherein the first partial reflector is a multi-layer dielectric.

11. The injection laser of claims 1, 2 or 3 wherein the active region is a buried heterostructure.

12. The injection laser of claim 11 wherein the active region is a dual-channel buried heterostructure.

13. The injection laser of claims 1, 2 or 3 wherein the active region is a ridge waveguide structure.

14. The injection laser of claims 1, 2 or 3 wherein the active region is comprised of alloys of III-V compounds.

15. The injection laser of claims 1, 2 or 3 which further comprises means for providing wavelength selective loss, wherein the loss occurring at the wavelength of the main mode of the laser cavity is less than the loss occurring at the wavelength of other modes.

16. The injection laser of claim 15 wherein the means for providing wavelength selective loss is a selective partial reflector which has a value of reflectivity at the wavelength of the main mode of the laser cavity that is less than 10% higher than the value of reflectivity occurring at wavelengths different from that of the main mode.

17. A laser source for a communications system having a signal source, the laser source comprising:
an active laser region having a first end and a second end, the first end being a partial reflector of laser radiation generated in the active laser region,
means for injection pumping the active laser region to produce the laser radiation, and
a passive waveguide region having a first end and a second end, the first end being a partial reflector of the laser radiation whose index of refraction is responsive to a varying voltage, and wherein the active laser region and the passive waveguide region are joined to one another at the second ends of each one to form a laser cavity between the first ends of the active laser region and the passive waveguide region; and wherein the passive waveguide region has an index of refraction which is substantially equal to the index of refraction of the active region and is substantially loss and reflection free and frequency nonselective for a length whichis at least as great as the length of the active laser region, and
means for applying a voltage, responsive to variations of the signal source, to the partial reflector of said passive waveguide region, whereby the index of refraction of the partial reflector of said passive waveguide region and thereby the laser output radiation is varied.

* * * * *